United States Patent
Shim et al.

(10) Patent No.: US 9,768,386 B2
(45) Date of Patent: Sep. 19, 2017

(54) COMPOSITION FOR ENCAPSULATION FILM, ENCAPSULATION FILM, AND ELECTRONIC DEVICE COMPRISING THE SAME

(71) Applicant: LG CHEM, LTD., Seoul (KR)

(72) Inventors: Jung Sup Shim, Daejeon (KR); Yoon Gyung Cho, Daejeon (KR); Suk Ky Chang, Daejeon (KR); Hyun Jee Yoo, Daejeon (KR); Seung Min Lee, Daejeon (KR); Kyung Yul Bae, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/899,978

(22) PCT Filed: Jun. 18, 2014

(86) PCT No.: PCT/KR2014/005386
§ 371 (c)(1),
(2) Date: Dec. 18, 2015

(87) PCT Pub. No.: WO2014/204223
PCT Pub. Date: Dec. 24, 2014

(65) Prior Publication Data
US 2016/0149131 A1 May 26, 2016

(30) Foreign Application Priority Data

Jun. 19, 2013 (KR) .......................... 10-2013-0070636
Jun. 18, 2014 (KR) .......................... 10-2014-0074588

(51) Int. Cl.
| | | |
|---|---|---|
| C08J 5/18 | (2006.01) |
| C08L 23/22 | (2006.01) |
| H01L 51/00 | (2006.01) |
| H01L 51/52 | (2006.01) |
| C08L 101/02 | (2006.01) |
| H01L 23/29 | (2006.01) |

(52) U.S. Cl.
CPC .............. *H01L 51/004* (2013.01); *C08J 5/18* (2013.01); *C08L 23/22* (2013.01); *C08L 101/02* (2013.01); *H01L 23/293* (2013.01); *H01L 51/0043* (2013.01); *H01L 51/5253* (2013.01); *H01L 51/5259* (2013.01); *C08J 2323/22* (2013.01); *C08J 2423/30* (2013.01); *C08L 2203/206* (2013.01); *C08L 2205/02* (2013.01); *C08L 2205/08* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,502,970 A * | 3/1985 | Schetelich | C10M 167/00 508/192 |
| 8,809,442 B2 | 8/2014 | Kageyama | |
| 2011/0105637 A1* | 5/2011 | Fujita | C08L 23/22 522/120 |
| 2012/0118469 A1 | 5/2012 | Joly et al. | |
| 2012/0322910 A1 | 12/2012 | Chatterjee et al. | |

FOREIGN PATENT DOCUMENTS

| | | |
|---|---|---|
| CN | 200980153573.5 | 11/2009 |
| CN | 102083930 A | 6/2011 |
| CN | 102272221 A | 12/2011 |
| JP | 2000080274 | 3/2000 |
| JP | 2011077360 | 4/2011 |
| JP | 2011152720 | 8/2011 |
| JP | 2012015204 | 1/2012 |
| JP | 2012182407 | 9/2012 |
| KR | 1020120046704 | 5/2012 |
| KR | 101224713 | 1/2013 |
| TW | 201002796 A | 1/2010 |
| TW | 201224011 | 6/2012 |
| WO | 2010060064 | 5/2010 |
| WO | 2011062167 A1 | 5/2011 |
| WO | 2013165637 A1 | 11/2013 |

* cited by examiner

*Primary Examiner* — Sheeba Ahmed
(74) *Attorney, Agent, or Firm* — Dentons US LLP

(57) ABSTRACT

There are provided a composition for encapsulation film, an encapsulation film, and an electronic device having the same. The present application may provide an encapsulation film having an excellent moisture barrier property, operability, workability, and durability and a structure including an element encapsulated by the encapsulation film.

12 Claims, No Drawings

COMPOSITION FOR ENCAPSULATION FILM, ENCAPSULATION FILM, AND ELECTRONIC DEVICE COMPRISING THE SAME

CROSS-REFERENCE

This application is a National Stage Application of International Application No. PCT/KR2014/005386, filed Jun. 18, 2014, and claims priority to and the benefit of Korean Patent Application No. 10-2014-0074588, filed on Jun. 18, 2014 and Korean Patent Application No. 10-2013-0070636, filed Jun. 19, 2013, the contents of each which is incorporated by reference in its entirety for all purposes as if fully set forth below.

TECHNICAL FIELD

The present application relates to a composition for encapsulation film, an encapsulation film, and an electronic device comprising the same.

BACKGROUND ART

Encapsulant materials may be used for protecting elements, devices, and the like which are sensitive to external factors such as moisture or oxygen. The elements or devices that may be protected by the encapsulant material include, for example, organic electronic devices, solar cells, or rechargeable batteries such as lithium rechargeable batteries. In particular, among the elements or the devices, organic electronic devices are vulnerable to external factors such as water or oxygen.

The organic electronic device is a device including a functional organic material. As the organic electronic device or an organic electronic element included in the organic electronic device, a photovoltaic device, a rectifier, a transmitter, an organic light emitting diode (OLED), and the like may be exemplified.

In general, organic electronic devices are vulnerable to external factors such as water. For example, an organic light emitting element generally includes a layer made of a functional organic material that is present between a pair of electrodes including a metal or a metal oxide. When water penetrates from the outside, there are problems in which the layer made of the organic material is released due to an influence of water at an interface with the electrode, the electrode is oxidized by water which results in an increase in a resistance value, and the organic material itself is altered which results in a loss of a light-emitting function or a decrease in brightness. Accordingly, in order to protect organic light emitting elements from elements of an external environment such as water, an encapsulation structure in which an organic light emitting element formed on a substrate is covered by a glass or metal can having a getter or a moisture absorbent provided therein and is fixed with an adhesive, and the like is used.

DISCLOSURE

Technical Problem

The present application provides a composition for encapsulation film, an encapsulation film, and an electronic device having the same.

Technical Solution

According to an aspect of the present application, there is provided a composition for encapsulation film. An example of the composition for encapsulation film includes a base resin and an additive having a polar functional group. Therefore, an encapsulation film made of the composition may ensure adhesion reliability under high temperature and high humidity conditions, have no decrease in an optical property of the film and have no decrease in moisture barrier performance, since a backbone of the additive having a polar functional group has compatibility with the base resin. Therefore, even when the film is applied to, for example, a device having a large area to protect an element, the film may be laminated on the element without generation of bubbles and the like and may effectively protect the element from external components such as moisture after an encapsulation process.

The composition according to the aspect of the present application includes the base resin and the additive. In an example, the base resin has a repeating unit of following Chemical Formula 1, and the additive has a main chain whose repeating unit is following Chemical Formula 1.

[Chemical Formula 1]

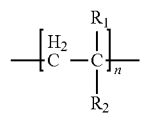

In Chemical Formula 1, $R_1$ and $R_2$ each independently represent hydrogen or an alkyl group having 1 to 12 carbon atoms, and n is 1 or more.

In the above description, $R_1$ and $R_2$ may be, for example, an alkyl group having 1 to 8 carbon atoms, or 1 to 4 carbon atoms such as a methyl group, an ethyl group, and a propyl group, but the alkyl group is not limited thereto.

When the base resin has the repeating unit based on the above Chemical Formula 1 and the additive has the main chain including the repeating unit based on the above Chemical Formula 1, the main chain of the additive and the base resin may have compatibility. Accordingly, as described above, it is possible to provide an encapsulation film having no decrease in an optical property or moisture barrier performance.

In an example, the base resin of the encapsulation film may be a copolymer containing 90 mol % or more of a polyisobutylene resin or isobutylene, for example, an isobutylene-isoprene copolymer. The base resin refers to a configuration other than optional components such as the additive. In an example, when the additive such as a tackifier is added to the film, the base resin may refer to a configuration other than the tackifier.

The polyisobutylene resin is a resin that has a polyisobutylene backbone at a main chain or a side chain and has an excellent moisture barrier property since the resin itself has low moisture transmittance. Also, the polyisobutylene resin has low surface energy. Therefore, an adhesive composition having the polyisobutylene resin as the base resin is appropriate for encapsulating a plastic organic electronic device that is sensitive to a difference of a coefficient of thermal expansion of a substrate.

Specifically, as the polyisobutylene resin, for example, a homopolymer of an isobutylene monomer; a copolymer obtained by copolymerizing the isobutylene monomer with other polymerizable monomers, and the like, may be used. Here, examples of the other monomers polymerizable with the isobutylene monomer may include 1-butene, 2-butene, isoprene, butadiene, and the like.

A weight average molecular weight (Mw) of the polyisobutylene resin serving as a base resin may be about 100,000 to 2,000,000, 100,000 to 1,500,000, or 100,000 to 1,000,000, but the weight is not limited thereto. The term "weight average molecular weight" in this specification refers to a conversion value of a standard polystyrene measured using a gel permeation chromatograph (GPC).

Also, the base resin may have an appropriate glass transition temperature in order to have an excellent moisture barrier property and have a rubber state at room temperature. For example, the glass transition temperature of the base resin may be −50° C. or less, for example, −60° C. or less, or −70° C. or less.

However, the polyisobutylene resin itself is a hydrophobic resin having no polar functional group and may have low adhesion reliability under high temperature and high humidity conditions. When reliability of the organic electronic device is evaluated, it is important to maintain adhesion reliability under high temperature and high humidity conditions in addition to adhesion at room temperature. Therefore, in the present application, an additive having a polar functional group is introduced to complement such weak points.

In an example, the additive may be a compound represented by Chemical Formula 2.

[Chemical Formula 2]

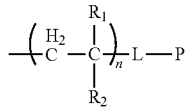

In Chemical Formula 2, $R_1$ and $R_2$ each independently represent hydrogen or an alkyl group having 1 to 12 carbon atoms, L represents a single bond or an organic linker formed of at least one selected from the group consisting of an alkylene, an arylene, an ether, an ester, a carbonyl, an allyl, an alkylallyl, an acryloyl, and an alkenylene or combinations thereof, P represents a polar functional group, and n is 1 or more.

Since the additive has a main chain whose repeating unit is based on Chemical Formula 1, the additive has compatibility with the base resin and does not interfere with transparency of the film. In an example, a main chain of the additive may be a polyisobutenyl, but the main chain is not limited thereto.

In an example, the polar functional group may include at least one selected from the group consisting of an acid anhydride group, an amide group, an alkoxy group, an alcohol group, an aldehyde group, a carbonyl group, a carboxyl group, an ester group, an ether group, an epoxy group, an amino group, a sulfone group, a hydroxyl group, and maleic acid. The polar functional group is a functional group that may give adhesion to a glass, metal or plastic surface. Some of the functional groups may be involved in a curing reaction or a cross-linking reaction and control a flow of components constituting the film in a matrix.

In an example, the additive may be at least one selected from the group consisting of a polyisobutenyl succinic anhydride, a polyisobutenyl amine, and a polyisobutenyl alcohol. When the additive is the polyisobutenyl succinic anhydride, it has a terminal double bond with an acid anhydride group due to its structure. Such reactants may be involved in curing or crosslinking structure formation, and fix additives having a low molecular weight such that the additives do not suspend in a matrix or a surface after a cross-linking reaction.

A weight average molecular weight of the additive may be 100 g/mol to 10,000 g/mol, and preferably, 1,000 g/mol to 5,000 g/mol, but the weight is not limited thereto.

Glissopal SA (BASF SE) is a commercially available polar additive, however, a polyisobutylene may be functionalized and used according to the following reactions, but the present invention is not limited thereto.

i) Provide an aromatic hydroxy compound alkylated with a polyisobutylene through a reaction of a reactive polyisobutylene and an aromatic hydroxy compound in the presence of an alkylating catalyst, ii) Provide a polyisobutylene epoxidized through a reaction of a reactive polyisobutylene and a peroxy compound, iii) A reaction of a reactive polyisobutylene and an alkene having a substituted double bond, iv) Provide a polyisobutylene hydroformylated through a reaction of a reactive polyisobutylene, carbon monoxide, and hydrogen in the presence of a hydroformylation catalyst, v) Provide a polyisobutylene functionalized with a phosphono group through a reaction of a reactive polyisobutylene, a phosphorus halide, or phosphorus oxychloride, vi) Provide a polyisobutylene hydroxylated through a reaction of a reactive polyisobutylene and borane and subsequent oxidative decomposition, vii) Provide a polyisobutylene having a terminal sulfone group through a reaction of a reactive polyisobutylene and a $SO_3$ source such as acetyl sulfate, viii) Provide a polyisobutylene having a terminal amino group through a reaction of a reactive polyisobutylene and a nitrogen oxide, and subsequent hydrogenation, ix) Provide a polyisobutylene functionalized with a thiol group through a reaction of a reactive polyisobutylene, hydrogen sulfide, or thiol.

When the additive is a polyisobutenyl succinic anhydride (PIBSA), various grades of the polyisobutenyl succinic anhydride may be used according to a molecular weight thereof since viscosity generally increases as the molecular weight increases. For example, a polyisobutenyl succinic anhydride having a number-average molecular weight of 1000 to 10,000 g/mol may be used for the composition of the present application.

The additive may be included in an amount of 1 to 50 parts by weight with respect to 100 parts by weight of the polyisobutylene resin serving as a base resin, and in another example, at 5 to 30 parts by weight. Unless otherwise specifically defined herein, the unit "parts by weight" refers to a weight ratio.

The composition may further include other resin components in addition to the base resin. For example, a styrene-based resin, a polyolefin-based resin, a thermoplastic elastomer, a polyoxyalkylene-based resin, a polyester-based resin, a polyvinyl chloride-based resin, a polycarbonate-based resin, a polyphenylene sulfide-based resin, mixtures of hydrocarbons, a polyamide-based resin, an acrylate-based resin, an epoxy-based resin, a silicone-based resin, a fluorine-based resin or mixtures thereof may be included.

In the above description, examples of the styrene-based resin may include a styrene-ethylene-butadiene-styrene (SEBS) block copolymer, a styrene-isoprene-styrene (SIS) block copolymer, an acrylonitrile-butadiene-styrene (ABS) block copolymer, an acrylonitrile-styrene-acrylate (ASA) block copolymer, a styrene-butadiene-styrene (SBS) block copolymer, a styrene-based homopolymer, or mixtures thereof. Examples of the olefin-based resin may include a high-density polyethylene-based resin, a low-density polyethylene-based resin, a polypropylene-based resin, or mixtures thereof. Examples of the thermoplastic elastomer may include an ester-based thermoplastic elastomer, an olefin-based thermoplastic elastomer, or a mixture thereof. Among these, as the olefin-based thermoplastic elastomer, a polybutadiene resin and the like may be used. Examples of the polyoxyalkylene-based resin may include a polyoxymethylene-based resin, a polyoxyethylene-based resin, or a mixture thereof. Examples of the polyester-based resin may include a polyethyleneterephthalate-based resin, a polybutyleneterephthalate-based resin, or a mixture thereof. Examples of the polyvinyl chloride-based resin may include polyvinylidene chloride and the like. Examples of the mixtures of hydrocarbons may include hexatriacotane, paraffin, and the like. Examples of the polyamide-based resin may include nylon and the like. Examples of the acrylate-based resin may include polybutyl(meth)acrylate and the like. Examples of the epoxy-based resin may include a bisphenol type such as a bisphenol A type, a bisphenol F type, a bisphenol S type and water-added materials thereof; a novolac type such as a phenol novolac type and a cresol novolac type; a nitrogen-containing ring type such as a triglycidyl isocyanurate type and a hydantoin type; an alicyclic type; an aliphatic type; a naphthalene type, an aromatic type such as a biphenyl type; a glycidyl type such as a glycidyl ether type, a glycidylamine type, and a glycidyl ester type; a dicyclo type such as a dicyclopentadiene type; an ester type; an etherester type, or mixtures thereof. Examples of the silicone-based resin may include polydimethylsiloxane and the like. Also, examples of the fluorine-based resin may include a polytrifluoroethylene resin, a polytetrafluoroethylene resin, a polychlorotrifluoroethylene resin, a polyhexafluoropropylene resin, polyvinylidene fluoride, polyvinyl fluoride, poly(fluorinated ethylene-propylene), or mixtures thereof.

When the listed resins are used, they may be grafted with, for example, maleic anhydride and the like, may be copolymerized with other listed resins or monomers for preparing resins, or may be modified by other compounds. Examples of the other compounds may include a carboxyl-terminated butadiene-acrylonitrile copolymer and the like.

In addition, in order to exhibit an adhesive property by curing, the listed resins may include, for example, at least one functional group or part that may be cured by heat such as a glycidyl group, an isocyanate group, a hydroxyl group, a carboxyl group, or an amide group, or at least one functional group or part that may be cured by radiation of active energy rays, such as an epoxide group, a cyclic ether group, a sulfide group, an acetal group, or a lactone group.

In an example, the composition may include a moisture absorbent. The term "moisture absorbent" in this specification may refer to, for example, a material that can remove moisture by chemically reacting with water or moisture which had penetrated into the encapsulation film. The moisture absorbent may be included in an amount of 1 part by weight to 100 parts by weight with respect to 100 parts by weight of the base resin, but the ratio is not limited thereto.

In an example, the moisture absorbent may be in a uniformly dispersed state in the film. Here, the uniformly dispersed state may refer to a state in which the water absorbent has the same density or substantially the same density in any part of a matrix of the film. In the above description, the moisture absorbent to be used may include, for example, a metal oxide, a sulfate, or an organic metal oxide. Specifically, examples of the metal oxide may include a magnesium oxide, a calcium oxide, a strontium oxide, a barium oxide, or an aluminum oxide, and examples of the sulfate may include magnesium sulfate, sodium sulfate, or nickel sulfate, and examples of the organic metal oxide may include aluminum oxide octylate. As the moisture absorbent, one type or two or more types of the above configurations may be used. In an example, when two or more types are used as the moisture absorbent, calcined dolomite and the like may be used.

The water absorbent may be controlled to have an appropriate size depending on usage purposes of the film. In an example, the moisture absorbent may be controlled to have an average particle diameter of 10 to 15000 nm. The moisture absorbent having a size in the above range is easy to store since a reaction rate with moisture is not too fast, does not cause damage to an element to be encapsulated, and may effectively remove moisture.

Also, in an example, the encapsulation film may further include a dispersant in order for the moisture absorbent to be uniformly dispersed in a resin component. As a dispersant that may be used herein, for example, a nonionic surfactant having an affinity with a surface of a hydrophilic moisture absorbent, and good compatibility with the resin component may be used. In an example, as the nonionic surfactant, a compound represented by Chemical Formula 3 may be used.

R—X  [Chemical Formula 3]

In Chemical Formula 3, R represents a saturated or unsaturated hydrocarbon group, and X represents a hydroxyl group, a carboxyl group, an amino group, or a carbohydrate residue.

In Chemical Formula 3, R may be a saturated or unsaturated hydrocarbon group having 4 to 28 carbon atoms, 4 to 24 carbon atoms, 4 to 20 carbon atoms, or 6 to 20 carbon atoms.

In addition, a compound in which X is a carbohydrate residue in Chemical Formula 3 may refer to a compound in which any hydrogen of a carbohydrate is substituted with R. Examples of the carbohydrate may include glucose and the like.

Examples of the compound of Chemical Formula 3 may include a fatty acid such as stearic acid, palmitic acid, oleic acid, or linoleic acid; a fatty alcohol such as cetyl alcohol, stearyl alcohol, cetostearyl alcohol, or oleyl alcohol; or an alkyl glucoside such as octyl glucoside, decyl glucoside, or lauryl glucoside.

A content of the dispersant may be controlled according to a type and/or a size of the moisture absorbent. Specifically, it is possible to uniformly disperse the moisture absorbent when a large amount of the dispersant is used since a surface area of the moisture absorbent increases as the size of the moisture absorbent decreases. In an example, when a moisture absorbent having an average particle diameter of about 40 nm is used, a dispersant of about 5 parts by weight or more with respect to 100 parts by weight of the moisture absorbent may be used. In another example, when a moisture absorbent having an average particle diameter of about 1000 nm is used, a dispersant of about 0.05 parts by weight or more with respect to 100 parts by weight of the moisture absorbent may be used. Therefore, in consideration of a type and/or a size of the moisture absorbent, a dispersant of about 0.01 to 500 parts by weight with respect to 100 parts by weight of the moisture absorbent may be used. Within such a range, it is possible to uniformly disperse the moisture absorbent without influences on general physical properties such as adhesion of the film.

As a method of adding the moisture absorbent and the dispersant to the resin component, methods used in the related art may be used without limitation. However, a method capable of uniformly dispersing the moisture absorbent to the resin component by regulating a blending sequence is exemplified. First, the dispersant is dispersed in a solvent to prepare a dispersion solution. Here, the solvent may be selected based on coatability, a drying temperature, compatibility with the resin component, and the like. When the polyisobutylene resin is the base resin, an aromatic solvent such as toluene or xylene may be used as the solvent of the dispersant. The moisture absorbent is input and mixed in the dispersion solution. In this case, a process of mixing the moisture absorbent with the dispersion solution may additionally use a physical dispersion method in order to increase a degree of dispersion of the moisture absorbent. Examples of the physical dispersion method may include a method of using a shaker, a sonication method, a bead milling method, and the like. The solution in which the moisture absorbent and the dispersant are dispersed may be input to a composition for manufacturing the film. The solution in which the moisture absorbent and the dispersant are dispersed is optionally filtered to filter very large particles and may be input to the solution containing the resin component. Through the above process, it is possible to manufacture the film in which the moisture absorbent and the dispersant are uniformly dispersed. However, the process is not limited to the above description, but may be simply changed by those skilled in the art.

The composition may also include a moisture blocker. The term "moisture blocker" in this specification may refer to a material having little or no reactivity with moisture penetrating into the film or a material that may block or prevent water or moisture from flowing in the film. Examples of the moisture blocker may include clay, talc, needle-like silica, plate-like silica, porous silica, zeolite, titania, zirconia, or combinations thereof. Also, a surface of the moisture blocker may be treated with an organic modifier and the like to facilitate penetration of the organic material. As the organic modifier, for example, dimethyl benzyl hydrogenatedtallow quaternary ammonium, dimethyl hydrogenatedtallow quaternary ammonium, methyl tallow bis-2-hydroxyethyl quaternary ammonium, dimethyl hydrogenatedtallow 2-ethylhexyl quaternary ammonium, dimethyl dihydrogenatedtallow quaternary ammonium, or an organic modifier of mixtures thereof may be used.

A content of the moisture blocker that may be included in the composition may be appropriately regulated based on relationship between the moisture absorbent and a matrix structure of the resin component. In an example, a content of the moisture blocker may be regulated at about 0 to 50 parts by weight or 1 to 30 parts by weight with respect to 100 parts by weight of the resin component. Within such a range, it is possible to provide a film having an excellent moisture barrier property and mechanical property.

In an example, even when the composition includes both the moisture absorbent and the moisture blocker, it is possible to uniformly disperse the moisture absorbent and the moisture blocker in the resin component by controlling a component blending sequence.

For example, first, the moisture blocker is input to the solvent to prepare a first dispersion solution. In this case, the first dispersion solution may be obtained as a dispersion solution that is uniformly dispersed through processes such as sonication, bead milling, ball milling, high speed dispersion, and high pressure dispersion. Additionally, a second dispersion solution in which the moisture absorbent and/or the dispersant are dispersed as described above is prepared. The prepared first dispersion solution and second dispersion solution are input and mixed in the solution containing the resin component. When the solutions are mixed, a solvent may be further input in consideration of viscosity adjustment and coatability of the resin composition. According to such a method, it is possible to manufacture a film in which the moisture absorbent and the blocker are uniformly dispersed. The manufacturing method may be freely changed when the change is apparent to those skilled in the art.

The composition may include a tackifier. As the tackifier, for example, a hydrogenated petroleum resin obtained by hydrogenating a petroleum resin may be used. The hydrogenated petroleum resin may be partially or completely hydrogenated, or may be a mixture thereof. As the tackifier, a tackifier having good compatibility with the resin component and an excellent moisture barrier property may be selected. Specific examples of the hydrogenated petroleum resin may include a hydrogenated terpene-based resin, a hydrogenated ester-based resin, a hydrogenated dicyclopentadiene-based resin, and the like. The tackifier may have a weight average molecular weight of about 200 to 5,000. A content of the tackifier may be appropriately adjusted as necessary. For example, the tackifier may be included in the film at a ratio of 5 parts by weight to 100 parts by weight with respect to 100 parts by weight of the resin component.

As the tackifier, a tackifier having a softening temperature of 80 to 150° C. may also be used, but the tackifier is not limited thereto.

In addition to the above-described components, various additives may be included in the composition according to a usage of the film and a manufacturing process of the film. For example, a curable material may be further included in consideration of durability, processability, and the like. Here, the curable material may refer to a material having a thermosetting functional group and/or an active energy ray curable functional group that are/is separately included in addition to the above resin component. In addition, a content of the curable material may be regulated according to a desired physical property of the film.

In an example, the composition may include a curable resin or a curable monomer. As the curable resin, a thermosetting resin, an active energy ray curable resin, or a mixed curable resin, which is known in the related art, may be used. The term "thermosetting resin" in this specification may refer to a resin that may be cured by applying appropriate heat or an aging process. The term "active energy ray curable resin" may refer to a resin that may be cured by radiation of active energy rays. The term "mixed curable resin" may refer to a resin that may be cured by a simultaneous or sequential curing mechanism of thermosetting and active energy ray curable resins. Also, in the above description, examples of the active energy rays may include microwaves, infrared (IR) rays, ultraviolet (UV) rays, X-rays, gamma rays, or a particle beam such as an alpha-particle beam, a proton beam, a neutron beam, or an electron beam.

As the curable resin, a resin that may exhibit an adhesive property by curing may be used. For example, a resin having at least one functional group or part that may be cured by heat such as a glycidyl group, an isocyanate group, a hydroxyl group, a carboxyl group, or an amide group may be used, and a resin having at least one functional group or part that may be cured by radiation of active energy rays such as an epoxide group, a cyclic ether group, a sulfide group, an acetal group, or a lactone group may be used. Examples of the curable resin may include an acryl resin, a polyester resin, an isocyanate resin, or an epoxy resin which has at least one functional group or part described above, but the curable resin is not limited thereto.

In an example, as the curable resin, the epoxy resin may be used. The epoxy resin may be an aromatic-based or aliphatic-based epoxy resin. As the epoxy resin, a thermosetting epoxy resin may be used or an active energy ray curable resin, for example, an epoxy resin that is cured by a cationic polymerization reaction due to radiation of active energy rays, may be used.

The epoxy resin according to the example may have an epoxide equivalent weight of 150 g/eq to 2,000 g/eq. At epoxide equivalent weights within this range, properties of a cured product such as adhesive performance or a glass transition temperature may be maintained in an appropriate range.

In an example, the epoxy resin may be a silane-modified epoxy resin. As the silane-modified epoxy resin, for example, a reaction product of a silane compound and at least one epoxy resin among the above-described epoxy resins may be used. In the above description, as the silane compound, for example, a compound represented by Chemical Formula 4 may be exemplified.

$$D_nSiQ_{(4-n)}$$ [Chemical Formula 4]

In Chemical Formula 4, D represents a vinyl group, an epoxy group, an amino group, an acryl group, a methacrylic group, a mercapto group, an alkoxy group, or an isocyanate group, or an alkyl group substituted with any functional group among these, Q represents hydrogen, an alkyl group, a halogen, an alkoxy group, an aryl group, an aryloxy group, an acyloxy group, an alkylthio group, or an alkyleneoxythio group, and n is 1 to 3.

In a compound of Chemical Formula 4, the functional group D may react with a functional group included in the epoxy resin and form the silane-modified epoxy resin.

When the functional group is, for example, the amino group, the amino group may react with an epoxy group of the epoxy resin, form a bond of "—CH(OH)—CH$_2$—NH—," and the silane compound may be introduced into the epoxy group.

Also, when the functional group D is the isocyanate group or the alkoxy group, the silane compound may be introduced by reacting with an epoxy resin containing a hydroxyl group (OH), for example, a bisphenol type epoxy resin such as a bisphenol F type epoxy resin, a bisphenol F type novolac epoxy resin, a bisphenol A type epoxy resin, or a bisphenol A type novolac epoxy resin.

In Chemical Formula 4, as the alkyl group, an alkyl group having 1 to 20 carbon atoms, 1 to 16 carbon atoms, 1 to 12 carbon atoms, 1 to 8 carbon atoms, or 1 to 4 carbon atoms may be exemplified. The alkyl group may be linear, branched, or cyclic type alkyl group.

In Chemical Formula 4, as a halogen atom, fluorine (F), chlorine (Cl), bromine (Br), iodine (I), and the like may be exemplified.

Also, in Chemical Formula 4, as the alkoxy group, an alkoxy group having 1 to 20 carbon atoms, 1 to 12 carbon atoms, 1 to 8 carbon atoms, or 1 to 4 carbon atoms may be exemplified. The alkoxy group may be a straight chain, branched, or cyclic type.

Also, in Chemical Formula 4, as the aryl group or in the aryl group included in the aryloxy group, an aralkyl group and the like may be included in addition to the aryl group. For example, the aryl group may refer to a compound having at least one benzene ring or a structure in which two or more benzene rings are connected or condensed or a monovalent residue derived from a derivative thereof. The aryl group may be, for example, an aryl group having 6 to 25 carbon atoms, 6 to 21 carbon atoms, 6 to 18 carbon atoms, or 6 to 12 carbon atoms. Examples of the aryl group may include a phenyl group, a dichlorophenyl group, a chlorophenyl group, a phenylethyl group, a phenylpropyl group, a benzyl group, a tolyl group, a xylyl group, or a naphthyl group.

Also, in Chemical Formula 4, as the acyloxy group, an acyloxy group having 1 to 20 carbon atoms, 1 to 16 carbon atoms, or 1 to 12 carbon atoms may be exemplified.

Also, in Chemical Formula 4, as the alkylthio group, an alkylthio group having 1 to 20 carbon atoms, 1 to 16 carbon atoms, 1 to 12 carbon atoms, 1 to 8 carbon atoms, or 1 to 4 carbon atoms may be exemplified. As the alkyleneoxythio group, an alkyleneoxythio group having 1 to 20 carbon atoms, 1 to 16 carbon atoms, 1 to 12 carbon atoms, 1 to 8 carbon atoms, or 1 to 4 carbon atoms may be exemplified.

The alkyl group, the alkoxy group, the aryl group, the acyloxy group, the alkylthio group, or the alkyleneoxythio group may be arbitrarily substituted with at least one substituent. Examples of the substituent may include a hydroxyl group, an epoxy group, an alkyl group, an alkenyl group, an alkynyl group, an alkoxy group, an acyl group, a thiol group, an acryloyl group, a methacryloyl group, an aryl group, or an isocyanate group, but the substituent is not limited thereto.

In Chemical Formula 4, the functional group D may be, for example, the alkoxy group, the amino group, or the isocyanate group among the above.

Also, in Chemical Formula 4, at least one, two or more, or three among functional groups Q may be, for example, a halogen atom, the alkoxy group, the aryloxy group, the acyloxy group, the alkylthio group, the alkyleneoxythio group, or the alkoxy group.

As the silane-modified epoxy resin, for example, an epoxy resin in which a silane compound of about 0.1 parts by weight to about 10 parts by weight, about 0.1 parts by weight to about 9 parts by weight, about 0.1 parts by weight to about 8 parts by weight, about 0.1 parts by weight to about 7 parts by weight, about 0.1 parts by weight to about 6 parts by weight, about 0.1 parts by weight to about 5 parts by weight, about 0.1 parts by weight to about 4 parts by weight, about 0.1 parts by weight to about 3 parts by weight, about 0.3 parts by weight to 2 parts by weight, or about 0.5 parts by weight to about 2 parts by weight is introduced with respect to 100 parts by weight of the epoxy resin may be used. When a silane-modified epoxy resin having a silane group in its structure is used, the encapsulation layer of the electronic device exhibits an excellent adhesive property with the substrate and the like, and an excellent moisture barrier property, durability, and reliability may be exhibited.

The composition may further include a curing agent that may form a crosslinking structure and the like by reacting with the curable resin according to a type of the curable resin or an initiator that may initiate a curing reaction of the resin.

A type of the curing agent may be appropriately selected and used according to the curable resin or a type of the functional group included in the resin.

In an example, when the curable resin is the epoxy resin, curing agents of the epoxy resin known in the related art, for example, an amine curing agent, an imidazole curing agent, a phenol curing agent, a phosphorus curing agent, an anhydride curing agent, or mixtures thereof may be used as the curing agent, but the curing agent is not limited thereto.

In an example, as the curing agent, an imidazole compound that is in a solid state at room temperature and has a melting point or decomposition temperature of 80° C. or more may be used. Examples of such a compound may include 2-methylimidazole, 2-heptadecylimidazole, 2-phenylimidazole, 2-phenyl-4-methylimidazole, or 1-cyanoethyl-2-phenylimidazole, but the compound is not limited thereto.

A content of the curing agent may be selected according to a configuration of the composition, for example, a type or a ratio of the curable resin. For example, the curing agent may be included in an amount of 1 part by weight to 20 parts by weight, 1 part by weight to 10 parts by weight, or 1 part by weight to 5 parts by weight with respect to 100 parts by weight of the curable resin. However, the weight ratio may be changed according to the curable resin, a type and a ratio of the functional group of the resin, a crosslinking density to be implemented, and the like.

When the curable resin is an epoxy resin that may be cured by radiation of active energy rays, as the initiator, for example, a cationic photopolymerization initiator may be used.

As the cationic photopolymerization initiator, an onium-salt-based or organometallic-salt-based ionized cationic initiator, an organic-silane-based or latent-sulfonic-acid-based initiator or a nonionized cationic photopolymerization initiator may be used. As the onium-salt-based initiator, a diaryliodonium salt, a triarylsulfonium salt, an aryldiazonium salt, and the like may be exemplified. As the organometallic-salt-based initiator, an iron arene and the like may be exemplified. As the organic-silane-based initiator, an o-nitro benzyl triarylsilyl ether, a triaryl silyl peroxide, an acyl silane, and the like may be exemplified. As the latent-sulfonic-acid-based initiator, an α-sulfonyloxy ketone, an α-hydroxymethyl benzoin sulfonate, and the like may be exemplified, but the initiator is not limited thereto.

In an example, as the cationic initiator, the ionized cationic photopolymerization initiator may be used.

Similar to the curing agent, a content of the initiator may be changed according to the curable resin, a type and a ratio of the functional group of the resin, a crosslinking density to be implemented, and the like. For example, the initiator may be mixed at a ratio of 0.01 part by weight to 10 parts by weight or 0.1 part by weight to 3 parts by weight with respect to 100 parts by weight of the curable resin. When the content of the initiator is too small, curing may not sufficiently proceed. When the content thereof is too large, a content of an ionic material after curing increases. Therefore, durability of the adhesive decreases or a conjugate acid is formed due to properties of the initiator, which is disadvantageous in terms of optical durability and corrosion may occur according to the substrate. An appropriate content range may be selected in consideration of such problems.

Also, in a range at which a desired effect may not be influenced, an additive such as a plasticizer, an ultraviolet stabilizer, and/or an antioxidant may be further included.

According to another aspect of the present application, there is provided an encapsulation film formed of the above composition.

The encapsulation film of the present application includes a base resin and an additive having a polar functional group. Therefore, the film may ensure adhesion reliability under high temperature and high humidity conditions, have no decrease in an optical property of the film since a backbone of the additive having a polar functional group has compatibility with the base resin, and have no decrease in moisture barrier performance. Therefore, even when the film is applied to, for example, a device having a large area to protect an element, the film may be laminated on the element without bubbles and the like and may effectively protect the element from external components such as moisture after an encapsulation process.

An exemplary film of the present application includes the base resin and the additive. In an example, the base resin has a repeating unit of following Chemical Formula 1, and the additive has a main chain whose repeating unit is based on Chemical Formula 1.

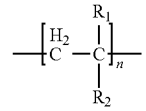

[Chemical Formula 1]

In Chemical Formula 1, $R_1$ and $R_2$ each independently represent hydrogen or an alkyl group having 1 to 12 carbon atoms, and n is 1 or more. In the above description, $R_1$ and $R_2$ may be, for example, an alkyl group having 1 to 8 carbon atoms, or 1 to 4 carbon atoms such as a methyl group, an ethyl group, and a propyl group, but the alkyl group is not limited thereto.

When the base resin has the repeating unit based on Chemical Formula 1 and the additive has the main chain including the repeating unit based on Chemical Formula 1, the base resin and the main chain of the additive may have compatibility. Accordingly, as described above, it is possible to provide an encapsulation film having no decrease in an optical property or moisture barrier performance.

The additive may be a compound represented by Chemical Formula 2.

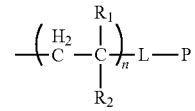

[Chemical Formula 2]

In Chemical Formula 2, $R_1$ and $R_2$ each independently represent hydrogen or an alkyl group having 1 to 12 carbon atoms, L represents a single bond or an organic linker formed of at least one selected from the group consisting of an alkylene, an arylene, an ether, an ester, a carbonyl, an allyl, an alkylallyl, an acryloyl, and an alkenylene or combinations thereof, P represents a polar functional group, and n is 1 or more.

Since the additive has a main chain whose repeating unit is based on Chemical Formula 1, the additive has compatibility with the base resin and does not interfere with transparency of the film.

The film may include components included in the above-described composition in addition to the base resin and the additive. Since descriptions of the base resin, the additive, and other detailed components are the same as those in the composition, repeated descriptions thereof will be omitted.

In an example, the encapsulation film may satisfy General Formula 1.

$P_r \geq 2000$ gf/in  [General Formula 1]

In General Formula 1, $P_r$ represents a peel strength of the encapsulation film with respect to glass measured at room temperature, a peel rate of 10 mm/sec, and a peel angle of 180°.

For example, in the encapsulation film of the present application, a peel strength of the encapsulation film with respect to glass measured at room temperature, a peel rate of 10 mm/sec, and a peel angle of 180° may be 2000 gf/in or more, for example, 2100 gf/in or more, 2200 gf/in or more, 2300 gf/in or more, or 2400 gf/in or more, and preferably, 2500 gf/in or more.

In addition, the encapsulation film of the present application may satisfy General Formula 2.

$$P_h \geq 500 \text{ gf/in} \qquad \text{[General Formula 2]}$$

In General Formula 2, $P_h$ represents a peel strength of the encapsulation film with respect to glass measured at a peel rate of 10 mm/sec and a peel angle of 180° after the encapsulation film is maintained under conditions at 85° C. and a relative humidity of 85% for 24 to 100 hours.

For example, when the encapsulation film of the present application is maintained under conditions at 85° C. and a relative humidity of 85% for 24 to 100 hours and then a peel strength of the encapsulation film on glass is measured at a peel rate of 10 mm/sec and a peel angle of 180°, the peel strength may be 500 gf/in or more, for example, 1000 gf/in or more, 1500 gf/in or more, 1800 gf/in or more, 2000 gf/in or more, 2300 gf/in or more, 2600 gf/in or more or 3000 gf/in or more, and preferably, 3500 gf/in or more.

That is, when the encapsulation film of the present application includes the additive having a polar functional group, excellent adhesion with the substrate at room temperature may be provided and excellent adhesion reliability may also be provided even when the film is left in high temperature and high humidity conditions.

Also, under conditions at 100° F. and a relative humidity of 100%, the encapsulation film may have a moisture transmittance of less than 10 g/m²·day, for example, 5 g/m²·day or less, 3 g/m²·day or less, and preferably, 2 g/m²·day or less.

The water vapor transmission rate may be a water vapor transmission rate when a film having a thickness of 100 μm is manufactured and the rate is measured in a thickness direction of the film under conditions at 100° F. and a relative humidity of 100%. The present application may provide a film exhibiting an excellent moisture barrier property by controlling the water vapor transmission rate as described above. As the water vapor transmission rate decreases, the moisture barrier property becomes excellent, and thus a lower limit thereof is not specifically limited. For example, the lower limit of the water vapor transmission rate of the resin component may be 0 g/m²·day, 0.1 g/m²·day, 0.01 g/m²·day, or 0.001 g/m²·day.

The encapsulation film may have various structures and may be made of, for example, a single layer, or multiple layers containing the polyisobutylene resin, and further include a separate layer in addition to the layer containing the polyisobutylene resin.

In an example, the encapsulation film may have a multilayer structure including a first layer containing the polyisobutylene resin and a second layer containing a resin other than the polyisobutylene resin.

As a binder resin for forming the second layer, a phenoxy resin, an acrylate resin, or a high molecular weight epoxy resin may be used. In the above description, the high molecular weight epoxy resin may refer to, for example, a resin having a weight average molecular weight of about 2,000 to 70,000 or about 4,000 to 6,000. As the high molecular weight epoxy resin, a solid type bisphenol A type epoxy resin, a solid type bisphenol F type epoxy resin, and the like may be exemplified. As the binder resin, a rubber component such as high polarity functional group-containing rubber or high polarity functional group-containing reactive rubber may be used. In an example, as the binder resin, the phenoxy resin may be used.

When the encapsulation film has a two-layer structure, each layer may have a different elastic modulus. When the first layer has a smaller elastic modulus than the second layer, the film may be beneficially applied to a device having a large area, and it is possible to effectively provide a moisture barrier property to the film by adjusting a ratio of the moisture absorbent between layers. In general, when the moisture absorbent reacts with moisture in the film, a volume thereof expands according to an extent to which the moisture absorbent reacts with moisture and stress is caused. Therefore, when sufficient elasticity at which expansion stress in moisture removal may be alleviated is not provided, the film may be released from an adherend or interlayer release and the like may be caused in the multi-layer structure film. However, the film of the present application uses the polyisobutylene resin having a glass transition temperature that is much lower than room temperature as the base resin, such that expansion stress may not be caused and thereby interlayer release may not be generated.

In an example, the encapsulation film may include the moisture absorbent. In this case, the first layer may include a larger amount of the moisture absorbent than the second layer. The second layer may include less moisture absorbent than the first layer or include no moisture absorbent. As will be described below, in the above structure, for example, when an encapsulating structure in which the second layer comes in contact with the element is implemented, it is possible to implement an excellent water or moisture barrier property without damage to the element. For example, the first layer may include the resin component and may include the moisture absorbent of 5 parts by weight or more, 10 parts by weight or more, 20 parts by weight or more, 30 parts by weight or more, 40 parts by weight or more, or 45 parts by weight or more with respect to 100 parts by weight of the resin component. An upper limit of a ratio of the moisture absorbent of the first layer is changed according to a desired moisture barrier property and is not specifically limited. For example, the first layer may include the moisture absorbent of 250 parts by weight or less, 230 parts by weight or less, or 210 parts by weight or less with respect to 100 parts by weight of the resin component. The second layer may have no moisture absorbent. Even when the moisture absorbent is included, a small amount of the moisture absorbent may be included. For example, the second layer may include the moisture absorbent of less than 5 parts by weight or less than 3 parts by weight with respect to 100 parts by weight of a solid content of the second layer. Since the second layer may have no moisture absorbent, a lower limit of the content of the moisture absorbent of the second layer may be 0 parts by weight.

The second layer may be a layer including, for example, a curable resin composition. The second layer may be a hot melt type adhesive layer. The term "hot melt type adhesive layer" in this specification may refer to a layer that maintains a solid or semi-solid state at room temperature, melts and exhibits adhesiveness when appropriate heat is applied, and is able to firmly fix an object material, as an adhesive after curing. Also, the term "curing of the adhesive" in this specification may refer to a chemical or physical action or reaction which enables the object material to be changed to exhibit an adhesive property. Also, the term "room temperature" refers to a natural temperature without any introduced heating or cooling, and may refer to a temperature of, for example, about 15° C. to 35° C., about 20° C. to 25° C., or about 25° C. or 23° C. Also, in the above description, maintaining the solid or semi-solid state at room temperature may refer to the fact that the object material exhibits a viscosity of about $10^6$ poise or more, or about $10^7$ poise or more at room temperature. In the above description, the viscosity is measured using an advanced rheometric expansion system (ARES). In the above description, an upper limit of the viscosity is not specifically limited, and may be, for example, about $10^9$ poise or less.

For example, when components such as the curable resin composition contained in the second layer are not cured, the second layer may maintain a solid or semi-solid state at room temperature. Therefore, the second layer may include the curable resin composition in the form of a film. Accordingly, it is possible to provide the second layer that is easy to handle, prevents physical or chemical damage of elements in application of an encapsulation process and the like, and can be smoothly processed.

The encapsulation film may further include, for example, a substrate. The substrate may be disposed on, for example, either or both surfaces of the film. The substrate may be, for example, a release-treated substrate. Substrates used in the related art may be used without limitation.

The encapsulant film may be applied to encapsulate and protect various objects. In particular, the film may be effective in protecting an object including an element that is sensitive to external factors, for example, water or moisture. Examples of the object to which the encapsulant film may be applied may include a photovoltaic device, a rectifier, a transmitter, an organic electronic device such as an organic light emitting diode (OLED) and the like, a solar cell, a rechargeable battery, and the like, but the object is not limited thereto.

According to still another aspect of the present application, there is provided an electronic device including an upper substrate; a lower substrate; and an encapsulation layer having a film provided between the upper substrate and the lower substrate and encapsulating an element. In the above description, the term "element" may refer to any component of the electronic device. A representative example of the element that may be protected by the film may include an organic electronic element such as an organic light emitting element and the like, but the element is not limited thereto.

In an example, the film may be an encapsulation film including the above-described polyisobutylene resin and polar additive as essential components. The film may be, for example, in an uncured state. The encapsulation layer including such a film may be a layer formed of the cured film.

In the electronic device, the upper substrate and the lower substrate may be disposed to face each other. Also, the element is formed on a surface of the lower substrate, and the surface of the lower substrate may be a surface facing the upper substrate. The film is placed between the upper and lower substrates, and the film may substantially cover an entire surface of the element. Also, when the film has a multi-layer structure, a layer containing less water absorbent may be attached closer to the element. Therefore, it is possible to provide an electronic device having excellent interfacial adhesion between the encapsulant layer and the element or the lower substrate.

In an example, the electronic device may be the organic electronic device. The encapsulation layer may exhibit an excellent moisture barrier property and optical property in the organic electronic device, and may efficiently fix and support the upper substrate and the lower substrate. Also, for example, when the moisture absorbent is manufactured to a nanoscale size and is uniformly dispersed in the resin, the encapsulant layer may exhibit excellent transparency, and a stable encapsulant layer may be formed regardless of the organic electronic device being a top emission or bottom emission type.

The organic electronic device may have a general configuration known in the related art except that the encapsulation layer is composed of the above-described film. For example, as the lower and/or upper substrate, glass, a metal, a polymer film, and the like, which are generally used in the related art, may be used. Also, the organic electronic element may include, for example, a pair of electrodes, and a layer of an organic material formed between the pair of electrodes. Here, either of the pair of electrodes may be formed as a transparent electrode. Also, the layer of the organic material may include, for example, a hole transport layer, a light emitting layer, and an electron transport layer.

According to yet another aspect of the present application, there is provided a method of manufacturing an electronic device, including laminating the film in contact with the element on a substrate having the element formed thereon.

In an example, the method of manufacturing an electronic device may be a method of manufacturing the above-described electronic device.

In the above description, in lamination of the film in contact with the element, for example, the film may be applied such that the film covers an entire surface of the element.

Also, lamination of the film in contact with the element may include, for example, a process in which the film comes in contact with the element, and the film is heated to have fluidity and is compressed onto the element. Therefore, even in an electronic device having a large area, it is possible to provide an electronic device that has no performance degradation due to bubbles and the like.

Also, in order to prevent bubbles and the like from being generated between the element and the film, the compression may be performed using a vacuum press and the like.

Also, the method of manufacturing may include curing the film after lamination of the film in contact with the element. A curing process may be performed in an appropriate heating chamber or ultraviolet chamber according to, for example, a curing method of the curable resin. Heating conditions or radiating conditions of active energy rays may be appropriately selected in consideration of stability of the electronic device, curability of the curable resin composition, and the like.

In an example, the film may be previously transferred to the upper substrate of the electronic device before the film is laminated on the element. Accordingly, transfer of the film to the upper substrate may be performed by, for example, bringing the film in contact with the upper substrate and roll laminating.

While one exemplary method of manufacturing an electronic device has been described above, the method of manufacturing an electronic device is not limited thereto. The device may be manufactured by the method as described above, but a sequence, conditions, and the like of the process may be changed.

Advantageous Effects

The present application may provide an encapsulation film having an excellent moisture barrier property, operability, workability, and durability and a structure including an element encapsulated by the encapsulation film.

MODES OF THE INVENTION

Hereinafter, the film will be described in detail with reference to examples and comparative examples, but the scope of the film is not limited to the proposed examples.

Hereinafter, in the examples and comparative examples, physical properties were evaluated by the following methods.

1. Evaluation of Peel Strength

A pressure sensitive adhesive film of which a pressure sensitive adhesive layer has a thickness of about 50 μm was manufactured using the pressure sensitive adhesive composition of the examples or comparative examples. The manufactured pressure sensitive adhesive film was laminated with an unreleased-PET substrate film and cut to a size having a width of one inch and a length of 20 cm. Then, a release-treated substrate film of the pressure sensitive adhesive film was released and the pressure sensitive adhesive layer was attached to a glass plate to prepare a specimen. Then, a texture analyzer was used to measure a peel strength of 180° of the specimen while releasing at a peel rate of 10 mm/sec and a peel angle of 180°.

In order to evaluate adhesion reliability, a sample was left in an oven at 85° C. and a relative humidity of 85% for 100 hours, and then a change in the peel strength under high temperature and high humidity conditions was additionally observed.

2. Measurement of Water Vapor Transmission Rate

The base resin used in the examples or the resin used in the comparative examples was dissolved in the solvent to prepare a resin composition. The resin composition was applied onto a substrate film (release polyester film, RS-21G, manufactured by SKC Inc.) having a thickness of 38 μm, and then dried at 110° C. for 10 minutes to manufacture a layer having a film shape and a thickness of 100 μm. The film of each composition was cross-linked according to cross-linking conditions, and then the substrate film was released. While the layer having a film shape was provided under conditions at 100° F. and a relative humidity of 100%, the water vapor transmission rate of the layer having a film shape in a thickness direction was measured. The water vapor transmission rate was measured according to a standard of ASTM F1249.

3. Evaluation of Moisture Barrier Property

A size of 10 mm×10 mm (length×width) of calcium (Ca) was deposited on a glass substrate having a size of 12 mm×12 mm (length×width). Additionally, the film manufactured in the examples or comparative examples was cut to a size of 12 mm×12 mm (length×width). Then, a surface of the film was transferred to a cover glass. Then, a surface opposite to a surface to which the cover glass of the film is present was laminated on calcium of the glass substrate and heated and compressed under conditions at 50° C. and an atmosphere of 5 using an autoclave. An encapsulation layer was formed by curing at 100° C. for one hour or cured by radiation of ultraviolet at a light intensity of 2 J/cm$^2$ according to a configuration, and a specimen was prepared. Then, the specimen was maintained in a constant temperature and humidity chamber at 85° C. and a relative humidity of 85% for about 500 hours and a length in which the calcium-deposited part is oxidized and becomes transparent was measured. Calcium has a total length of 10 mm in a direction. When a length of an oxidized part from an end of the calcium is 5 mm, calcium is completely oxidized.

4. Measurement of Transmittance

The film manufactured in the exampled was cut to a size of 100 mm×100 mm and laminated using a vacuum laminator (LM-30×30-S, manufactured by NPC Inc.) at 150° C. for 10 minutes to prepare a specimen. An optical transmittance of the laminated specimen was measured using a hazemeter (NDH-5000) according to a JIS K 7105 method.

As the transmittance, an optical transmittance was measured when the moisture absorbent is not added.

Example 1—Manufacture of Film 100 parts by weight of calcined dolomite was input as the moisture absorbent, and stearic acid of 0.5 parts by weight was input as the dispersant at a solid concentration of 50 wt % to toluene to prepare a moisture absorbent solution. A ball milling process was performed on the solution for 24 hours. Also, separately, 100 parts by weight of a polyisobutylene resin (Product Name: B100, Manufacturer: BASF SE) having a weight average molecular weight of 1,100,000 was input to a reactor as the base resin at room temperature and 20 parts by weight of a polyisobutenyl succinic anhydride (PIBSA) was also input. 2 parts by weight of 2-ethyl-4-methylimidazole was input as the curing agent, 10 parts by weight of trimethylolpropane triglycidyl ether was input as the thermosetting resin, 30 parts by weight of a hydrogenated dicyclopentadiene-based resin (Product Name: SU-90, Manufacturer: Kolon Industries Inc.) was input as the tackifier, and then diluted with toluene such that a solid content becomes about 20 wt %. Then, an inside of the reactor was substituted with nitrogen and the prepared solution was homogenized. The moisture absorbent solution prepared in advance was input to the homogenized solution such that a content of the calcined dolomite becomes 50 parts by weight with respect to 100 parts by weight of the base resin and mixed to prepare a composition.

The prepared composition was applied onto a release surface of a release PET, dried at 110° C. for 10 minutes, and a film having a thickness of 50 μm was formed. The film was cured by heat at 100° C. for one hour as thermosetting conditions.

Example 2

A film was manufactured by the same manner as in Example 1 except that the polyisobutylene resin was included in an amount of 100 parts by weight, and polyisobutenyl succinic anhydride was included in an amount of 10 parts by weight.

Example 3

A film was manufactured by the same manner as in Example 1 except that 20 parts by weight of a polyisobutenyl amine was added instead of polyisobutenyl succinic anhydride.

Example 4

A film was manufactured by the same manner as in Example 1 except that 1 part by weight of 1-hydroxy-cyclohexyl-phenyl ketone (BASF SE, Irgacure 184) was used as a radical initiator instead of the thermosetting agent, and 10 parts by weight of trimethylolpropane triacrylate was used as a photocurable acrylate instead of the thermosetting resin. Photocuring of the film was performed by radiating ultraviolet at a light intensity of 2 J/cm$^2$.

TABLE 1

| | Example 1 | Example 2 | Example 3 | Example 4 |
|---|---|---|---|---|
| Base resin | B100 | B100 | B100 | B100 |
| Polar additive | PIBSA | PIBSA | PIBA | PIBSA |

TABLE 1-continued

|  | Example 1 | Example 2 | Example 3 | Example 4 |
|---|---|---|---|---|
| Tackifier | SU-90 | SU-90 | SU-90 | SU-90 |
| Curing agent/initiator | 2E4MZ | 2E4MZ | 2E4MZ | HCPK |
| Thermosetting/ photocurable resin | TMPTGE | TMPTGE | TMPTGE | TMPTA |
| Moisture absorbent | calcined dolomite | calcined dolomite | calcined dolomite | calcined dolomite |

B100: Polyisobutylene resin
PIBSA: Polyisobutenyl succinic anhydride
PIBA: Polyisobutenyl amine
SU-90: Hydrogenated dicyclopentadiene-based resin
2E4MZ: 2-Ethyl-4-methylimidazole
HCPK: 1-Hydroxy-cyclohexyl-phenyl ketone
TMPTGE: Trimethylolpropane triglycidyl ether
TMPTA: Trimethylolpropane triacrylate Comparative Example 1

A film was manufactured by the same manner as in Example 1 except that 100 parts by weight of the polyisobutylene resin was used without a polyisobutenyl succinic anhydride.

Comparative Example 2

100 parts by weight of a silane-modified epoxy resin (KSR-177, Kukdo Chemical Co., Ltd.) and 60 parts by weight of a phenoxy resin (YP-50, Dong Do Tech Co., Ltd.) were input to a reactor at room temperature and diluted with methylethylketone. 10 parts by weight of 2-ethyl-4-methylimidazole (Shikoku Chemicals Corp.) serving as a curing agent was input to the homogenized solution, and was stirred at a high speed for one hour. The moisture absorbent solution prepared in advance was input to the homogenized solution such that a content of the calcined dolomite was 50 parts by weight with respect to 100 parts by weight of the silane-modified epoxy resin and mixed to prepare a composition. The prepared composition was applied onto a release surface of a release PET and dried at 110° C. for 10 minutes to form a film having a thickness of 50 μm. The film was cured at 100° C. for 3 hours as thermosetting conditions.

Comparative Example 3

A film was manufactured by the same manner as in Example 1 except that 10 parts by weight of a polyester acrylate adhesion promoter (Sartomer Arkema Group, CN704) were added instead of the polyisobutenyl succinic anhydride.

TABLE 2

|  | Comparative Example 1 | Comparative Example 2 | Comparative Example 3 |
|---|---|---|---|
| Base resin | B100 | YP-50 | B100 |
| Polar additive | — | — | PEA |
| Tackifier | SU-90 | — | SU-90 |
| Curing agent/initiator | 2E4MZ | 2E4MZ | 2E4MZ |
| Thermosetting/ photocurable resin | TMPTGE | KSR-177 | TMPTGE |
| Moisture absorbent | calcined dolomite | calcined dolomite | calcined dolomite |

TABLE 2-continued

|  | Comparative Example 1 | Comparative Example 2 | Comparative Example 3 |
|---|---|---|---|

B100: Polyisobutylene resin
YP-50: Phenoxy resin
PEA: Polyester acrylate
SU-90: Hydrogenated dicyclopentadiene-based resin
2E4MZ: 2-Ethyl-4-methylimidazole
TMPTGE: Trimethylolpropane triglycidyl ether
KSR-177: Epoxy resin

TABLE 3

|  |  | Adhesion (gf/in), 0 hr | Adhesion (gf/in), 100 hr | Water vapor transmission rate (g/m²·day) | Moisture barrier property* | Transmittance (%) |
|---|---|---|---|---|---|---|
| Example | 1 | 2200 | 1600 | 3 | 1 | 93 |
|  | 2 | 2000 | 1300 | 4 | 1 | 94 |
|  | 3 | 2100 | 1500 | 3 | 1 | 92 |
|  | 4 | 2000 | 1400 | 3 | 2 | 94 |
| Comparative Example | 1 | 1400 | 400 | 3 | 3 | — |
|  | 2 | 2500 | 300 | 12 | 4 | — |
|  | 3 | 1500 | 300 | 7 | 3 | — |

*a length oxidized from a surface of calcium in a direction (unit: mm)

As can be seen in the evaluation of physical properties, the films of Examples 1 to 4 have excellent adhesion at room temperature, excellent adhesion under high temperature and high humidity conditions, a small water vapor transmission rate and exhibit an excellent property in moisture permeability. However, it can be seen that, since the polyisobutenyl succinic anhydride is not provided in Comparative Example 1, adhesion and adhesion reliability under high temperature and high humidity conditions are not provided to the extent of the examples. Also, it can be seen that Comparative Example 2, in which the polyisobutylene base resin is not used, has insufficient high temperature and high humidity adhesion compared to when the polyisobutylene base resin is used. In Comparative Example 3, it can be seen that optical transmittance and adhesion decrease since compatibility of the adhesion promoting additive with the polyisobutylene base resin is insufficient. When a polyisobutenyl resin modified with succinic anhydride is included, compatibility with the polyisobutylene resin serving as a base resin is excellent, transparency is not degraded, interfacial adhesion increases due to a polar functional group, and reliability under high temperature and high humidity conditions increases.

The invention claimed is:

1. An encapsulation film for an electronic device, including a composition comprising:
   a base resin having a repeating unit of Chemical Formula 1; and
   an additive having a compound represented by Chemical Formula 2,
   wherein the additive is included in an amount of 5 to 30 parts by weight with respect to 100 parts by weight of the base resin:

[Chemical Formula 1]

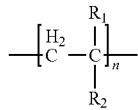

[Chemical Formula 2]

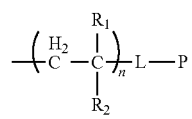

where, in Chemical Formula 1 and Chemical Formula 2, each of $R_1$ and $R_2$ independently represents hydrogen or an alkyl group having 1 to 12 carbon atoms, n and q are 1 or more, L is a single bond or an organic linker formed of at least one selected from the group consisting of an alkylene, an arylene, an ether, an ester, a carbonyl, an allyl, an alkylallyl, an acryloyl, an alkenylene and combinations thereof, and P is a polar functional group selected from the group consisting of an acid anhydride group, an amide group, an alkoxy group, an alcohol group, an aldehyde group, a carbonyl group, a carboxyl group, an ester group, an ether group, an epoxy group, an amino group, a sulfone group, a hydroxyl group, and a maleic acid.

2. The encapsulation film for the electronic device, including the composition of claim 1, wherein the base resin is a copolymer containing 90 mol % or more of a polyisobutylene or isobutylene.

3. The encapsulation film for the electronic device, including the composition of claim 1, wherein the additive is at least one selected from the group consisting of a polyisobutenyl succinic anhydride, a polyisobutenyl amine, and a polyisobutenyl alcohol.

4. The encapsulation film for the electronic device including the composition of claim 2, wherein the base resin has a weight average molecular weight of 100,000 to 2,000,000.

5. The encapsulation film for the electronic device, including the composition of claim 1, further comprising a moisture absorbent.

6. The encapsulation film for the electronic device, including the composition of claim 5, wherein the moisture absorbent is included in an amount of 1 part by weight to 100 parts by weight with respect to 100 parts by weight of the base resin.

7. The encapsulation film for the electronic device, including the composition of claim 1, further comprising a tackifier.

8. The encapsulation film for the electronic device, including the composition of claim 1, further comprising a curable resin.

9. The encapsulation film for the electronic device, including the composition of claim 1, wherein the encapsulation film satisfies General Formula 1:

$$P_r \geq 2000 \text{ gf/in} \qquad \text{[General Formula 1]}$$

where, in General Formula 1, $P_r$ represents a peel strength of the encapsulation film with respect to glass measured at room temperature, a peel rate of 10 mm/sec, and a peel angle of 180°.

10. The encapsulation film for the electronic device, including the composition of claim 1, wherein the encapsulation film satisfies General Formula 2:

$$P_h \geq 500 \text{ gf/in} \qquad \text{[General Formula 2]}$$

where, in General Formula 2, $P_h$ represents a peel strength of the encapsulation film with respect to glass measured at a peel rate of 10 mm/sec and a peel angle of 180° after the encapsulation film is maintained under conditions at 85° C. and a relative humidity of 85% for 24 to 100 hours.

11. The encapsulation film for the electronic device, including the composition of claim 1, wherein the encapsulation film has a moisture transmittance of less than 10 $g/m^2 \cdot day$ under conditions at 100° F. and a relative humidity of 100%.

12. An electronic device, comprising:
an upper substrate;
a lower substrate; and
the encapsulation film for the electronic device, including the composition according to claim 1 provided between the upper substrate and the lower substrate and encapsulating an element.

* * * * *